United States Patent
Dieterich et al.

(10) Patent No.: US 7,167,057 B2
(45) Date of Patent: Jan. 23, 2007

(54) MICROWAVE OSCILLATOR

(75) Inventors: Achim Dieterich, Murrhardt (DE); Udo Freitag, Soehlde (DE); Andreas Kugler, Alfdorf (DE); Martin Schneider, Hildesheim (DE); Joachim Hauk, Renningen-Malmsheim (DE); Juergen Hildebrandt, Weilheim (DE); Anette Fein, Kehl (DE); Andreas Reichert, Oberstenfeld (DE); Juergen Seiz, Welzheim (DE); Guenter Bertsch, Stuttgart (DE); Armin Himmelstoss, Weissach Im Tal (DE); Klaus-Dieter Miosga, Backnang (DE); Thomas Beez, Weinsberg (DE); Bernhard Lucas, Besigheim (DE); Sabine Koerber, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 30 days.

(21) Appl. No.: 10/528,962

(22) PCT Filed: May 19, 2003

(86) PCT No.: PCT/DE03/01601

§ 371 (c)(1),
(2), (4) Date: Mar. 22, 2005

(87) PCT Pub. No.: WO2004/042915

PCT Pub. Date: May 21, 2004

(65) Prior Publication Data

US 2006/0055475 A1   Mar. 16, 2006

(30) Foreign Application Priority Data

Nov. 2, 2002   (DE) ................ 102 51 036

(51) Int. Cl.
*H03B 1/00* (2006.01)
(52) U.S. Cl. .............. 331/69; 331/68; 331/107 DP; 331/107 SL
(58) Field of Classification Search ............ 331/68, 331/69, 107 DP, 107 SL
See application file for complete search history.

(56) References Cited

U.S. PATENT DOCUMENTS 4,890,074 A * 12/1989 Ondria ............... 331/107 SL
6,580,403 B2 * 6/2003 Lucas et al. ............ 343/872

FOREIGN PATENT DOCUMENTS

| EP | 0 379 258 | 7/1990 |
|----|-----------|--------|
| JP | 63 123205 | 5/1988 |
| JP | 07 212131 | 8/1995 |

* cited by examiner

*Primary Examiner*—Robert Pascal
*Assistant Examiner*—Levi Gannon
(74) *Attorney, Agent, or Firm*—Kenyon & Kenyon LLP

(57) ABSTRACT

A microwave oscillator having a hollow conductor, an oscillation generator which is mounted on a heatsink and projects into the hollow conductor, and a printed circuit board having electronic components for supplying direct voltage to the oscillation generator. The printed circuit board or a metallic coating on, in, or under this printed circuit board forms one wall of the hollow conductor, and the oscillator including its heatsink is located in the printed circuit board.

6 Claims, 1 Drawing Sheet

MICROWAVE OSCILLATOR

RELATED APPLICATION INFORMATION

The present application is a U.S. national phase patent application of international Patent Application No. PCT/DE03/01601, filed on May 19, 2003, which claims priority to German Patent Application No. 102 51 036.9, which was filed in Germany on Nov. 2, 2002.

FIELD OF THE INVENTION

The present invention relates to a microwave oscillator having a hollow conductor, an oscillation generator which is mounted on a heatsink and projects into the hollow conductor, and a printed circuit board having electronic components for supplying direct current voltage to the oscillation generator.

BACKGROUND INFORMATION

Microwave oscillators based on planar technology are known in which the oscillation generator and conductor structures for forming resonators, microwave conductors, filters, and the like are situated on a common substrate. However, for specific applications, e.g., a distance warning radar in motor vehicles, microwave oscillators based on hollow conductor technology are preferred, so that it is possible to satisfy the requirements for quality and performance of the oscillator.

A microwave oscillator known from the related art for a motor vehicle distance warning radar has a hollow conductor or oscillator body in the form of a metallic housing, which is screwed onto the radar device and is electrically connected by hand soldering using a lead. The oscillation generator is formed by a Gunn device, which projects into the oscillator body from below. The upper end of the oscillator body is closed by an insulating body to which a printed circuit board is attached. The Gunn device is supplied with direct voltage by a pin-like filter element, known as a bias choke, which extends from the printed circuit board through the interior of the oscillator body to the top of the Gunn device and acts as a lowpass filter. The printed circuit board includes a capacitive network, which is used to suppress voltage spikes when switching the oscillator on and off.

SUMMARY OF THE INVENTION

An object of the present invention is to provide a microwave oscillator of the type described above, which has a compact design and which may be manufactured and mounted in a more simple manner.

This objective is achieved in that the printed circuit board forms one wall of the hollow conductor and that the oscillation generator and its heatsink are embedded in the printed circuit board.

Because in this design, the oscillation generator, a Gunn device, for example, is attached directly in or on the printed circuit board, which also supports the circuit components for the supply of direct voltage to the Gunn device, it is not necessary for a pin-like bias choke to be mounted in the interior of the hollow conductor, and the production of the hollow conductor and the assembly of the printed circuit board and of the Gunn element are efficiently combined into a single operation. Because the heatsink, which supports the Gunn device, passes through the printed circuit board, the heat loss arising during operation of the Gunn device is effectively dissipated to the outside. In the area of the printed circuit board, the electrically conductive envelope of the hollow conductor may be formed by metallic coating of this printed circuit board or optionally by a metallic base plate, which is in contact with the printed circuit board.

In the oscillator of the present invention, the lowpass function of the conventional bias choke is preferably performed by a conductor structure, which is formed on the printed circuit board and is a part of the electrical feed to the Gunn device.

The microwave output of the oscillator is preferably formed by a stripline formed on the printed circuit board, the stripline being guided out of the hollow conductor and coupled to the microwave field within the hollow conductor.

In one embodiment, the hollow conductor is expanded to form a resonator chamber at the site of the Gunn device. In this way, it is possible to form a harmonic wave resonator, the fundamental wave of which is attenuated in the hollow conductor on the way from the resonator chamber to the coupling point of the stripline. The frequency may be tuned in a known manner using a tuning pin in the resonator chamber. In another embodiment, the tuning is performed in a known manner by rotation and/or vertical displacement of a resonator disc, which projects into the hollow conductor in a position diametrically opposite the Gunn device.

For an adjustment of power between the hollow conductor and the Gunn device, a choke piston is provided, which is situated slidably between the top wall of the hollow conductor and the lower wall formed by the printed circuit board.

DETAILED DESCRIPTION

Figure 1:
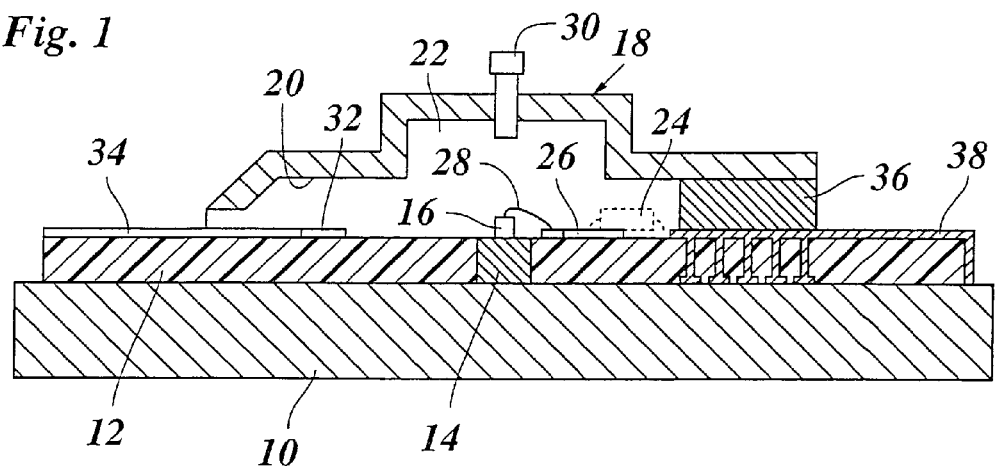
FIG. 1 shows a schematic sectional representation of the microwave oscillator according to a first embodiment.

The microwave oscillator shown in FIG. 1 has a metallic base plate 10, on which a printed circuit board 12 is in planar contact. Embedded into printed circuit board 12, the thickness of which is exaggerated in the drawing for reasons of clarity, is a heatsink 14 in the form of a copper block, which is in thermal and electrical contact with base plate 10. Situated on the top of heatsink 14 is an oscillation generator 16, which is formed here by a Gunn device. The lower electrode of the Gunn device is grounded via heatsink 14 and base plate 10.

An electrically grounded metallic housing 18, which together with printed circuit board 12 or associated base plate 10 borders a hollow conductor 20, arches over oscillation generator 16. At the position of oscillation generator 16, hollow conductor 20 is expanded to form a resonator chamber 22.

Outside of hollow conductor 20, electronic components 24 are situated on printed circuit board 12, these components being a part of a circuit for supplying oscillation generator 16 with direct voltage. For example, components 24 are capacitors, which are used to suppress voltage spikes when the oscillator is switched on and off. Oscillation generator 16 is supplied with direct voltage via a conductive structure 26 formed on printed circuit board 12, the conductive structure shown being connected to the upper electrode of the Gunn device via a bonding wire 28.

When a direct voltage is applied to oscillation generator 16 in this manner, the oscillator is excited to produce electronic oscillations based on the Gunn effect, for example, with a basic frequency of 38 GHz. Resonator chamber 22 is tuned to this basic frequency so that standing electromagnetic waves are excited in resonator chamber 22 using this basic frequency and its harmonics. A tuning pin 30, which projects into resonator chamber 22, is provided for the precise frequency tuning.

Hollow conductor 20 is dimensioned in such a way that it allows the first harmonic wave having a frequency of 76 GHz to pass, yet attenuates the fundamental wave. One part of the oscillation energy of the first harmonic wave is thus diverted via hollow conductor 20 and at a certain distance from resonator chamber 22 is coupled into a stripline 34 via a resonator 32 designed in the manner of an antenna patch, the stripline being guided out of hollow conductor 20 and forming the microwave output of the oscillator. The distance between resonator 32 and resonator chamber 22 is selected in such a way that the fundamental wave decays before it reaches resonator 32.

At the end diametrically opposite stripline 34, hollow conductor 20 is closed by a choke piston 36, which is used to adjust the power between hollow conductor 20 and oscillation generator 16. At least in the area of choke piston 36, the top of printed circuit board 12 has a metallic coat 38 which is connected to base plate 10 by printed circuit board 12 in a plurality of locations so that choke piston 36 is in electrical contact with base plate 10. Optionally, the bottom or the interior of printed circuit board 12 may also have a continuous metallic coating, which is not shown here and which instead of base plate 10, forms the electrical boundary of hollow conductor 20 and is simultaneously used as a shell electrode for stripline 34 and conductive structure 26.

Figure 2:
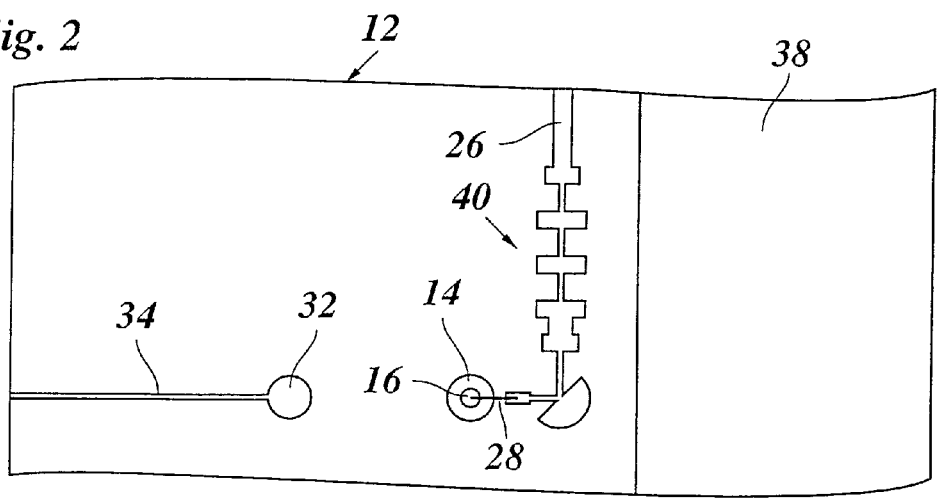
FIG. 2 shows a top view of a part of a printed circuit board of the microwave oscillator according to FIG. 1.

As FIG. 2 shows, conductive structure 26 forms a lowpass filter 40, via which the direct voltage component of the oscillator is screened against high-frequency oscillations.

Figure 3:
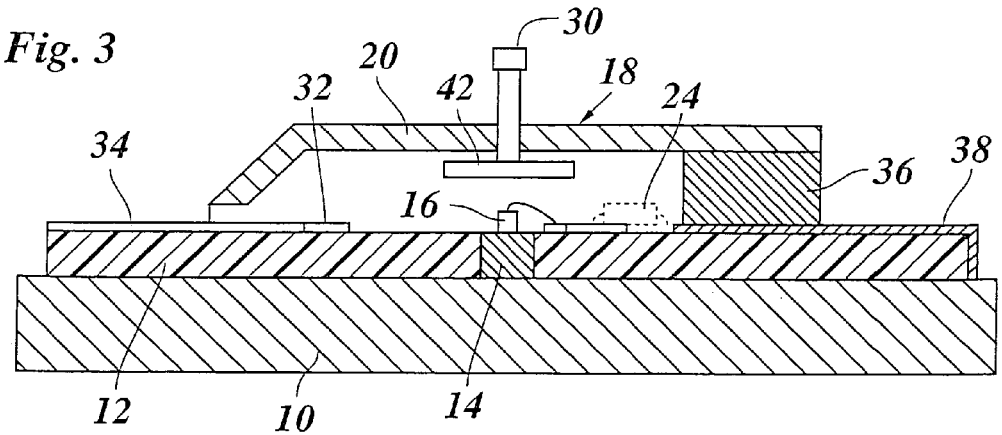
FIG. 3 shows a sectional representation of a microwave oscillator according to a second embodiment.

The exemplary embodiment shown in FIG. 3 differs from the exemplary embodiment of FIG. 1 in that chamber 22 is omitted. Instead, a rotatable and height-adjustable resonator disc 42 for frequency tuning is attached to the lower end of tuning pin 30.

What is claimed is:

1. A microwave oscillator comprising:
   a heatsink;
   a hollow conductor;
   an oscillation generator mounted on the heatsink and projecting into the hollow conductor;
   a printed circuit board having electronic components for supplying direct voltage to the oscillation generator, and
   a stripline situated on the printed circuit board, the stripline being coupled to a microwave field within the hollow conductor and being guided out of the hollow conductor as a microwave output,
   wherein one of (a) the printed circuit board and (b) a metal layer situated one of (1) on, (2) in, and (3) under the printed circuit board forms a wall of the hollow conductor, and the oscillation generator and the heatsink are situated in the printed circuit board,
   wherein the hollow conductor is expanded to form a resonator chamber in an area of the oscillation generator, and
   wherein the hollow conductor is impervious to a fundamental wave in the resonator chamber, and a distance between the stripline and the resonator chamber is greater than a decay distance of the fundamental wave.

2. The microwave oscillator according to claim 1, further comprising a conductive structure situated on the printed circuit board, forming a lowpass filter, and being connected electrically to the oscillation generator and the components for supplying direct voltage to the oscillator generator.

3. The microwave oscillator according to claim 1, further comprising a metallic base plate situated on a side of the printed circuit board facing away from the hollow conductor, the metallic base plate being electrically connected to other walls of the hollow conductor and being in thermal and electrical contact with the heatsink.

4. A microwave oscillator comprising:
   a heatsink;
   a hollow conductor;
   an oscillation generator mounted on the heatsink and projecting into the hollow conductor;
   a printed circuit board having electronic components for supplying direct voltage to the oscillation generator; and
   an adjustable resonator disc situated in the hollow conductor diametrically opposite the oscillation generator,
   wherein one of (a) the printed circuit board and (b) a metal layer situated one of (1) on, (2) in, and (3) under the printed circuit board forms a wall of the hollow conductor, and the oscillation generator and the heatsink are situated in the printed circuit board.

5. A microwave oscillator comprising:
   a heatsink;
   a hollow conductor;
   an oscillation generator mounted on the heatsink and projecting into the hollow conductor;
   a printed circuit board having electronic components for supplying direct voltage to the oscillation generator; and
   a choke piston for closing the hollow conductor at one end, the choke piston being in electrical contact with a metallic coating one of on, in, and under the printed circuit board,
   wherein one of (a) the printed circuit board and (b) a metallic coating situated one of (1) on, (2) in, and (3) under the printed circuit board forms a wall of the hollow conductor, and the oscillation generator and the heatsink are situated in the printed circuit board.

6. A microwave oscillator comprising:
   a heatsink;
   a hollow conductor;
   an oscillation generator mounted on the heatsink and projecting into the hollow conductor; and
   a printed circuit board having electronic components for supplying direct voltage to the oscillation generator;
   wherein one of (a) the printed circuit board and (b) a metallic coating situated one of (1) on, (2) in, and (3) under the printed circuit board forms a wall of the hollow conductor, and the oscillation generator and the heatsink are situated in the printed circuit board, and
   wherein the printed circuit board has at least one continuous metallic coating, which is electrically connected to other walls of the hollow conductor.

\* \* \* \* \*